(12) United States Patent
Minoura et al.

(10) Patent No.: US 10,483,185 B2
(45) Date of Patent: Nov. 19, 2019

(54) SEMICONDUCTOR DEVICE AND METHOD FOR MANUFACTURING SAME

(71) Applicant: FUJITSU LIMITED, Kawasaki-shi, Kanagawa (JP)

(72) Inventors: Yuichi Minoura, Machida (JP); Naoya Okamoto, Isehara (JP); Toshihiro Ohki, Hadano (JP)

(73) Assignee: FUJITSU LIMITED, Kanagawa (JP)

( * ) Notice: Subject to any disclaimer, the term of this patent is extended or adjusted under 35 U.S.C. 154(b) by 0 days.

(21) Appl. No.: 16/043,423

(22) Filed: Jul. 24, 2018

(65) Prior Publication Data
US 2019/0051579 A1  Feb. 14, 2019

(30) Foreign Application Priority Data
Aug. 10, 2017  (JP) .................. 2017-155032

(51) Int. Cl.
| | |
|---|---|
| H01L 23/373 | (2006.01) |
| H01L 29/778 | (2006.01) |
| H01L 29/16 | (2006.01) |
| H01L 21/48 | (2006.01) |
| H01L 29/20 | (2006.01) |
| H01L 21/304 | (2006.01) |
| H01L 29/04 | (2006.01) |
| H01L 23/00 | (2006.01) |

(52) U.S. Cl.
CPC ........ *H01L 23/3732* (2013.01); *H01L 21/304* (2013.01); *H01L 21/4803* (2013.01); *H01L 24/26* (2013.01); *H01L 29/04* (2013.01); *H01L 29/1608* (2013.01); *H01L 29/2003* (2013.01); *H01L 29/7786* (2013.01)

(58) Field of Classification Search
CPC .............. H01L 23/3732; H01L 21/304; H01L 21/4803; H01L 29/04; H01L 29/1608; H01L 29/2003; H01L 29/7786
See application file for complete search history.

(56) References Cited

U.S. PATENT DOCUMENTS

| | | | |
|---|---|---|---|
| 4,783,368 A | 11/1988 | Yamamoto et al. | |
| 5,247,203 A | 9/1993 | Shigihara et al. | |
| 5,332,695 A * | 7/1994 | Shigihara ............ | H01L 21/4882 228/123.1 |
| 2003/0071264 A1* | 4/2003 | Davidson ............ | H01L 21/4882 257/77 |
| 2003/0159817 A1* | 8/2003 | Azuma ............... | H01L 21/4882 165/185 |

(Continued)

FOREIGN PATENT DOCUMENTS

| | | |
|---|---|---|
| JP | 62-108551 A | 5/1987 |
| JP | 4-39956 A | 2/1992 |

*Primary Examiner* — Sitaramarao S Yechuri
(74) *Attorney, Agent, or Firm* — Westerman, Hattori, Daniels & Adrian, LLP

(57) ABSTRACT

A semiconductor device includes a semiconductor chip including a substrate and an element region on the substrate, a heat transfer body made of diamond, and a metal layer between the semiconductor chip and the heat transfer body, wherein the substrate includes an amorphous region on a back surface thereof, the amorphous region and the metal layer are bonded to each other, and the metal layer and the heat transfer body are bonded to each other.

13 Claims, 6 Drawing Sheets

(56) References Cited

U.S. PATENT DOCUMENTS

| | | | |
|---|---|---|---|
| 2006/0255341 A1* | 11/2006 | Pinnington | B82Y 20/00 |
| | | | 257/79 |
| 2009/0173939 A1* | 7/2009 | Berg | H01L 21/6836 |
| | | | 257/49 |
| 2009/0267080 A1* | 10/2009 | Takagi | H01G 4/33 |
| | | | 257/76 |
| 2014/0327049 A1* | 11/2014 | Lee | H01L 29/2003 |
| | | | 257/195 |

* cited by examiner

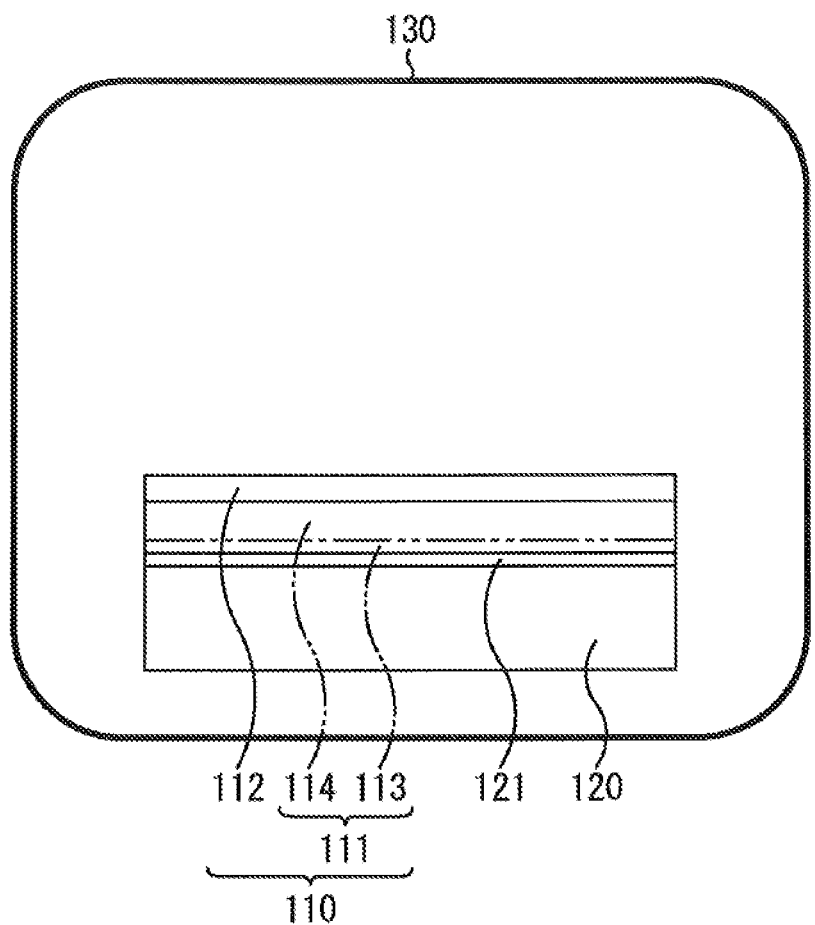

SEMICONDUCTOR DEVICE AND METHOD FOR MANUFACTURING SAME

CROSS-REFERENCE TO RELATED APPLICATIONS

This application is based upon and claims the benefit of priority of the prior Japanese Patent Application No. 2017-155032, filed on Aug. 10, 2017, the entire contents of which are incorporated herein by reference.

FIELD

The disclosures herein relate to a semiconductor device and a method for manufacturing the same.

BACKGROUND

The use of diamond having high thermal conductivity in a heat spreader or a heat sink application is effective in enhancing heat dissipation of a semiconductor device. Further, a surface activated bonding method for bonding diamond to a semiconductor substrate of a semiconductor device has been proposed. In the surface activated bonding method, surfaces to be bonded are smoothed, the surfaces are irradiated with a noble gas beam so as to be activated, and subsequently, the surfaces are stacked on each other. Although minute unevenness still exit on the surfaces even if the surfaces are smoothed, because the target object is slightly deformed, the surfaces can be bonded to each other.

However, because diamond has extremely high rigidity, diamond does not deform. Therefore, many gaps are formed between a semiconductor substrate and diamond. Especially, when a SiC substrate is used as a semiconductor substrate, many gaps tends to be formed. Such gaps cause a decrease in bonding strength and an increase in interface thermal resistance, resulting in reduction in heat dissipation.

RELATED-ART DOCUMENTS

Patent Document

[Patent Document 1] Japanese Laid-open Patent Publication No. 7-60869
[Patent Document 2] Japanese Patent No. 2726141

SUMMARY

According to an aspect of at least one embodiment, a semiconductor device includes a semiconductor chip including a substrate and an element region on the substrate, a heat transfer body made of diamond, and a metal layer between the semiconductor chip and the heat transfer body, wherein the substrate includes an amorphous region on a back surface thereof, the amorphous region and the metal layer are bonded to each other, and the metal layer and the heat transfer body are bonded to each other.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 4C is continued from FIG. 4B and is a cross-sectional view illustrating the manufacturing method according to the second embodiment.

DESCRIPTION OF EMBODIMENTS

In the following, embodiments of the present invention will be described with reference to the accompanying drawings.

First Embodiment

Figure 1:
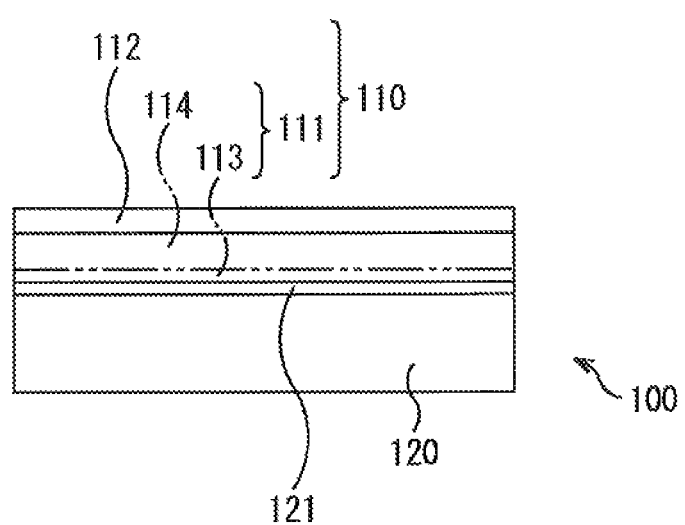
FIG. 1 is a diagram illustrating a semiconductor device according to a first embodiment.

First, a first embodiment will be described. FIG. 1 is a diagram illustrating a semiconductor device according to the first embodiment. As illustrated in FIG. 1, a semiconductor device 100 according to the first embodiment includes a semiconductor chip 110, a heat transfer body 120 made of diamond, and a metal layer 121 between the semiconductor chip 110 and the heat transfer body 120. The semiconductor chip 110 includes a substrate 111 and an element region 112 on the substrate 111. The substrate 111 includes an amorphous region 113 on its back surface. The amorphous region 113 and the metal layer 121 are bonded to each other, and the metal layer 121 and the heat transfer body 120 are bonded to each other. The substrate 111 is, for example, a SiC substrate, a Si substrate, a GaN substrate, a sapphire substrate, a GaAs substrate, an InP substrate, or a Ge substrate. The element region 112 includes at least one of a high electron mobility transistor (HEMT), a MOS transistor, a capacitance element, and wiring. The metal layer 121 includes, for example, Ti or Ta, and is preferably a Ti layer or a Ta layer. The substrate 111 may include a crystalline region 114 between the amorphous region 113 and the element region 112.

In the semiconductor device 100, the substrate 111 includes the amorphous region 113 on its back surface; and, the amorphous region 113 and the metal layer 121 are bonded to each other, and the metal layer 121 and the heat transfer body 120 are bonded to each other. Because the amorphous region 113 has lower rigidity than that of the crystalline region 114 and the metal layer 121 has lower rigidity than that of diamond, the amorphous region 113 and the metal layer 121 tend to deform. Therefore, extremely few gaps are formed between the amorphous region 113 and the metal layer 121, and also bonding strength therebetween is high and interface thermal resistance therebetween is low. Further, adhesion between the metal layer 121 and the heat transfer body 120 is high. Especially, adhesion between the Ti layer or the Ta layer and the heat transfer body 120 is high. Therefore, interface thermal resistance between the metal layer 121 and the heat transfer body 120 is low. Accordingly, the semiconductor device 100 can provide favorable heat dissipation. Namely, the heat transfer body 120 made of diamond can transfer heat generated in the semiconductor chip 110 to the outside at high efficiency.

In a case where the substrate 111 includes the crystalline region 114, the crystalline region 114 is preferably formed of a single crystal, such that more favorable heat dissipation can be obtained. Further, an element region 112 having favorable crystallinity can also be obtained. The heat transfer body 120 is preferably formed of single-crystal diamond, such that more favorable heat dissipation can be obtained. The heat transfer body 120 preferably has a thickness greater than or equal to 300 μm, such that more favorable heat dissipation can be obtained. The metal layer 121 preferably has a thickness less than or equal to 10 nm, and more preferably has a thickness less than or equal to 5 nm. This is because thermal conductivity of diamond is superior to that of the metal layer 121.

The amorphous region 113 preferably has a thickness greater than or equal to 1 nm. The metal layer 121 preferably has a thickness greater than or equal to 1 nm. In a case where the thickness of the amorphous region 113 is less than 1 nm or the thickness of the metal layer 121 is less than 1 nm, gaps tend to be formed between the amorphous region 113 and the metal layer 121.

When the element region 112 includes a nitride semiconductor such as GaN, the substrate 111 is preferably a SiC substrate in terms of crystal structure matching. More preferably, the substrate 111 is a SiC substrate and the element region 112 includes a GaN-based HEMT. When the substrate 111 is a SiC substrate, the amorphous region 113 is an amorphous SiC region. Compared to Si, SiC is a very hard substance and does not readily deform. However, compared to crystalline SiC, amorphous SiC easily deforms. Therefore, according to the first embodiment, even when the substrate 111 is a SiC substrate, favorable heat dissipation can be obtained.

Second Embodiment

Figure 2A:
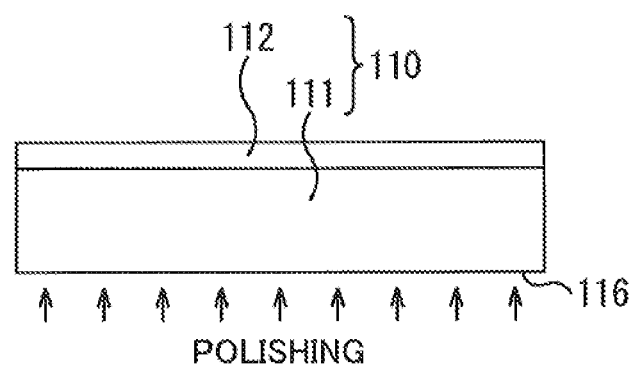
FIGS. 2A and 2B are cross-sectional views illustrating, in the order of steps, a method for preparing a semiconductor chip according to a second embodiment.
Figure 2B:
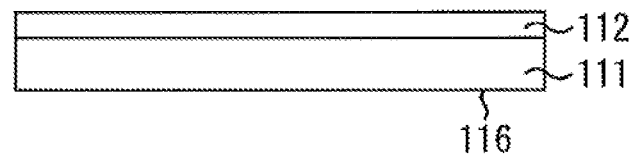
Figure 3A:
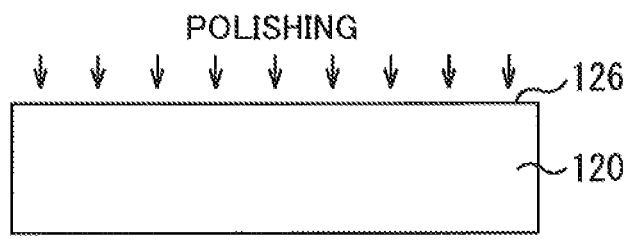
FIGS. 3A through 3C are cross-sectional views illustrating, in the order of steps, a method for preparing a heat transfer body according the second embodiment.
Figure 3B:
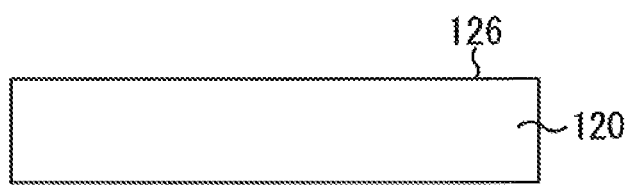
Figure 3C:
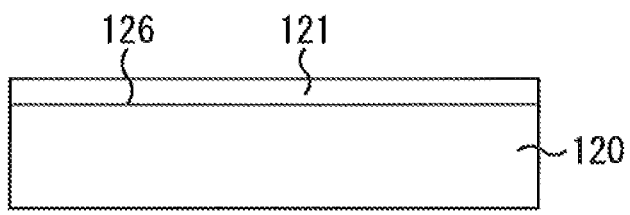
Figure 4A:
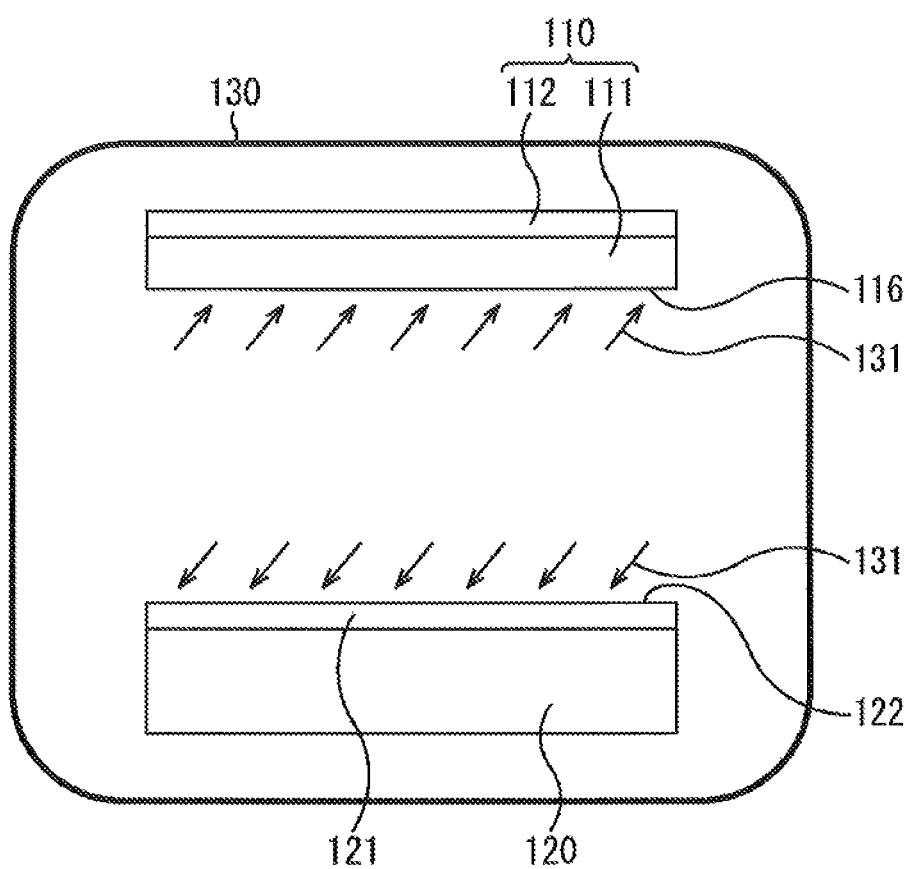
FIG. 4A is a cross-sectional view illustrating a manufacturing method according to the second embodiment.
Figure 4B:
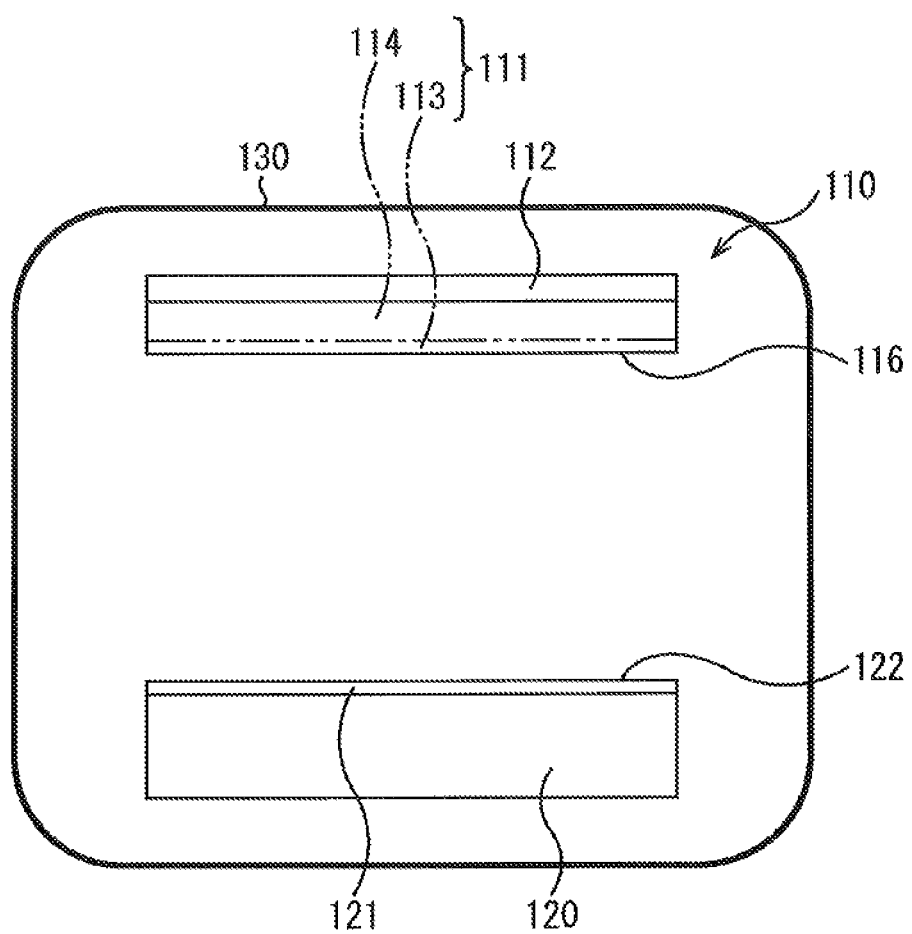
FIG. 4B is continued from FIG. 4A and is a cross-sectional view illustrating the manufacturing method according to the second embodiment.

Next, a second embodiment will be described. The second embodiment describes an example of a method for manufacturing the semiconductor device 100 according to the first embodiment. In the second embodiment, the semiconductor chip 110 and the heat transfer body 120 are separately prepared, and are bonded to each other by using surface activated bonding (SAB). FIGS. 2A and 2B are cross-sectional views illustrating, in the order of steps, a method for preparing the semiconductor chip 110. FIGS. 3A through 3C are cross-sectional views illustrating, in the order of steps, a method for preparing the heat transfer body 120. FIGS. 4A through 4C are cross-sectional view illustrating, in the order of steps, a manufacturing method according to the second embodiment.

In the method for preparing the semiconductor chip 110, as illustrated in FIG. 2A, the back surface (one surface) of the substrate 111, on the front surface of which, the element region 112 is formed, is polished first. Surface roughness Ra after polishing is measured by an atomic force microscope (AFM) and is preferably less than or equal to 1 nm. As illustrated in FIG. 2B, the substrate 111 becomes thin after polishing.

In the method for preparing the heat transfer body 120, as illustrated in FIG. 3A, a front surface 126 of the heat transfer body 120 made of diamond and having a plate shape or a film shape is polished. The front surface 126 preferably has a (100) plane orientation by Miller indices, such that the front surface 126 can be easily polished and more favorable thermal conductivity can be obtained. Examples of diamond include, for example, high-pressure synthetic diamond, chemical vapor deposition (CVD) diamond, and natural diamond. The surface roughness Ra after polishing is measured by the AFM and is preferably less than or equal to 1 nm. As illustrated in FIG. 3B, the heat transfer body 120 becomes thin. Next, as illustrated in FIG. 3C, the metal layer 121 is formed on the front surface 126. The metal layer 121 may be formed by a vapor deposition method or a sputtering method, for example. The metal layer 121 has a thickness of, for example, 5 nm to 20 nm. For example, the metal layer 121 is formed such that any projection and recess formed on the front surface 126 are embedded.

After the semiconductor chip 110 and the heat transfer body 120 are separately prepared, the semiconductor chip 110 and the heat transfer body 120 are placed in a chamber 130 and a vacuum is created in the chamber 130, as illustrated in FIG. 4A. Pressure in the chamber 130 is, for example, less than or equal to $5 \times 10^{-6}$ Pa. The back surface (one surface) of the semiconductor chip 110 and a front surface 122 of the metal layer 121 are irradiated with noble gas beams 131.

As a result, as illustrated in FIG. 4B, the amorphous region 113 is formed on the back surface 116, the metal layer 121 becomes thin, and the back surface 116 and the front surface 122 are activated. The thickness of the amorphous region 113 is preferably 1 nm to 10 nm. In a case where the thickness of the amorphous region 113 is less than 1 nm, the substrate 111 does not sometimes readily deform. Also, it takes significant time to form an amorphous region 113 having the thickness of greater than 10 nm. The thickness of the remaining metal layer 121 is preferably greater than or equal to 1 nm. In a case where the thickness of the metal layer 121 is less than 1 nm, projections formed on the front surface 126 of the heat transfer body 120 may be exposed through the metal layer 121. As the noble gas beams 131, Ar, Xe, He, Ne, or Kr gas beams may be used. A region other than the amorphous region 113 of the substrate 111 is the crystalline region 114.

Next, as illustrated in FIG. 4C, the activated back surface 116 and the front surface 122 are stacked on each other. Accordingly, the back surface 116 and the front surface 122 adhere to each other, and thus, the semiconductor chip 110 and the heat transfer body 120 are bonded to each other through the metal layer 121. Pressure may be applied to the back surface 116 and the front surface 122 while the back surface 116 and the front surface 122 are stacked on each other.

Accordingly, the semiconductor device 100 according to the first embodiment can be manufactured.

An element (Ar, Xe, He, Ne, or Kr) of the noble gas beams 131 may be included in the amorphous region 113. Namely, an element of the noble gas beams 131 may remain in the vicinity of the back surface 116. Further, in a case where the substrate 111 is a SiC substrate, Si is more easily removed than C upon irradiation with the noble gas beams 131. Therefore, the amorphous region 113 may include more C atoms than Si atoms. Namely, in the vicinity of the back surface 116, more C atoms may be included than Si atoms.

The heat transfer body 120 is preferable as a heat spreader. When the heat transfer body 120 is used as a heat spreader, a heat sink may be attached to the heat transfer body 120 or a package substrate formed of Cu, CuMo, or CuW may be attached to the heat transfer body 120, for example. The metal layer 121 is preferably a Ti layer or a Ta layer. This is because a thick oxide film will not be readily formed on the Ti layer and the Ta layer, and also the Ti layer and the Ta layer will not be readily eliminated when irradiated with the noble gas beams 131 at the level for forming the amorphous region 113.

According to at least one embodiment, a semiconductor device includes a substrate including an appropriate amorphous region, a heat transfer body, and a metal layer, allowing favorable heat dissipation to be obtained.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the more superiority and inferiority of the invention. Although the embodiment(s) of the present invention have been described in detail, it should be understood that the various changes, substitutions, and alterations could be made hereto without departing from the spirit and scope of the invention.

What is claimed is:

1. A semiconductor device comprising:
   a semiconductor chip including a substrate and an element region on the substrate;
   a heat transfer body made of diamond; and
   a metal layer between the semiconductor chip and the heat transfer body;
   wherein the substrate includes an amorphous region on a back surface thereof,
   the amorphous region and the metal layer are bonded to each other,
   the metal layer and the heat transfer body are bonded to each other,
   the substrate is a SiC substrate,
   the amorphous region is an amorphous SiC region, and
   an interface between the amorphous SiC region and the metal layer includes more C atoms than Si atoms.

2. The semiconductor device according to claim 1, wherein the element region includes a high-electron-mobility transistor.

3. The semiconductor device according to claim 1, wherein the amorphous SiC region includes Ar, Xe, He, Ne, or Kr.

4. The semiconductor device according to claim 1, wherein the metal layer has a thickness greater than or equal to 1 nm.

5. The semiconductor device according to claim 1, wherein the metal layer includes Ti or Ta.

6. The semiconductor device according to claim 1, wherein the SiC substrate includes a crystalline region between the amorphous SiC region and the element region.

7. A method for manufacturing a semiconductor device, the method comprising:
   polishing a back surface of a substrate of a semiconductor chip, the semiconductor chip including the substrate and an element region on the substrate;
   polishing a front surface of a heat transfer body made of diamond;
   forming a metal layer on the front surface of the heat transfer body;
   applying a noble gas to the back surface of the substrate and a front surface of the metal layer in a chamber where a vacuum is created, such that an amorphous region is formed on the substrate and also a back surface of the amorphous region and the front surface of the metal layer are activated; and
   causing the activated back surface of the amorphous region and the activated front surface of the metal layer to adhere to each other in the chamber, such that the semiconductor chip and the heat transfer body are bonded to each other,
   wherein the substrate is a SiC substrate,
   the amorphous region is an amorphous SiC region, and
   an interface between the amorphous SiC region and the metal layer includes more C atoms than Si atoms.

8. The method for manufacturing a semiconductor device according to claim 7, wherein
   surface roughness Ra of the back surface of the SiC substrate after polishing is less than or equal to 1 nm, and
   surface roughness Ra of the front surface of the heat transfer body after polishing is less than or equal to 1 nm.

9. The method for manufacturing a semiconductor device according to claim 7, wherein the element region includes a high-electron-mobility transistor.

10. The method for manufacturing a semiconductor device according to claim 7, wherein the noble gas includes Ar, Xe, He, Ne, or Kr.

11. The method for manufacturing a semiconductor device according to claim 7, wherein the thickness of the metal layer after the noble gas is applied is greater than or equal to 1 nm.

12. The method for manufacturing a semiconductor device according to claim 7, wherein the metal layer includes Ti or Ta.

13. The method for manufacturing a semiconductor device according to claim 7, wherein, after the noble gas is applied, the SiC substrate includes a crystalline region between the amorphous SiC region and the element region.

* * * * *